(12) United States Patent
Ryan

(10) Patent No.: US 9,583,380 B2
(45) Date of Patent: Feb. 28, 2017

(54) ANISOTROPIC MATERIAL DAMAGE PROCESS FOR ETCHING LOW-K DIELECTRIC MATERIALS

(71) Applicant: GLOBALFOUNDRIES Inc., Grand Cayman (KY)

(72) Inventor: Errol Todd Ryan, Clifton Park, NY (US)

(73) Assignee: GLOBALFOUNDRIES Inc., Grand Cayman (KY)

(\*) Notice: Subject to any disclaimer, the term of this patent is extended or adjusted under 35 U.S.C. 154(b) by 12 days.

(21) Appl. No.: 14/334,385

(22) Filed: Jul. 17, 2014

(65) Prior Publication Data

US 2016/0020140 A1    Jan. 21, 2016

(51) Int. Cl.

| | |
|---|---|
| H01L 21/76 | (2006.01) |
| H01L 21/4763 | (2006.01) |
| H01L 23/532 | (2006.01) |
| H01L 29/06 | (2006.01) |
| H01L 21/768 | (2006.01) |
| H01L 23/522 | (2006.01) |
| H01L 21/311 | (2006.01) |
| H01L 21/3105 | (2006.01) |

(52) U.S. Cl.
CPC .. *H01L 21/76802* (2013.01); *H01L 21/31111* (2013.01); *H01L 21/7682* (2013.01); *H01L 21/76825* (2013.01); *H01L 21/76826* (2013.01); *H01L 23/5222* (2013.01); *H01L 23/53295* (2013.01); *H01L 21/3105* (2013.01); *H01L 21/76834* (2013.01); *H01L 21/76849* (2013.01); *H01L 2924/0002* (2013.01)

(58) Field of Classification Search
CPC ........... H01L 21/3105; H01L 21/31111; H01L 21/31144; H01L 21/76885; H01L 21/76825; H01L 21/76834; H01L 21/76849; H01L 21/7682
USPC .......... 257/E21.495, E21.579; 438/618, 396, 438/619, 484, 637
See application file for complete search history.

(56) References Cited

U.S. PATENT DOCUMENTS

| | | | |
|---|---|---|---|
| 5,869,379 A | 2/1999 | Gardner et al. | 438/305 |
| 5,949,143 A | 9/1999 | Bang | 257/758 |
| 5,953,625 A | 9/1999 | Bang | 438/619 |

(Continued)

FOREIGN PATENT DOCUMENTS

| | | | |
|---|---|---|---|
| DE | 112007002215 T5 | 7/2009 | ......... H01L 21/3205 |
| DE | 102008044984 A1 | 7/2010 | ........... H01L 23/522 |

OTHER PUBLICATIONS

Translation of Official Communication from German Patent Office for German Patent Application No. 10 2009 023 377.6 dated Oct. 5, 2010.

(Continued)

*Primary Examiner* — Kimberly Rizkallah
*Assistant Examiner* — Brian Turner
(74) *Attorney, Agent, or Firm* — Amerson Law Firm, PLLC

(57) ABSTRACT

In one example, a method includes forming a mask layer above or in a dielectric material. The dielectric material is exposed to photon radiation in an ambient atmosphere comprising a carbon gettering agent to generate damaged portions of the dielectric material. The mask layer blocks the photon radiation. The damaged portions of the dielectric material are removed.

18 Claims, 4 Drawing Sheets

(56) References Cited

U.S. PATENT DOCUMENTS

| | | | |
|---|---|---|---|
| 6,160,316 A | 12/2000 | Gardner et al. | 257/773 |
| 6,312,874 B1 | 11/2001 | Chan et al. | 430/314 |
| 6,376,330 B1 | 4/2002 | Fulford, Jr. et al. | 438/421 |
| 6,713,835 B1 | 3/2004 | Horak et al. | 257/522 |
| 6,737,725 B2 | 5/2004 | Nitta et al. | 257/522 |
| 6,838,354 B2 | 1/2005 | Goldberg et al. | 438/408 |
| 6,838,355 B1 | 1/2005 | Stamper et al. | 438/409 |
| 7,026,235 B1 | 4/2006 | Ben-Tzur et al. | 438/619 |
| 7,319,274 B2 | 1/2008 | Beyer et al. | 257/774 |
| 7,868,455 B2 | 1/2011 | Chen | 257/750 |
| 8,048,796 B2 | 11/2011 | Seidel et al. | 438/618 |
| 8,399,335 B2 | 3/2013 | Huisinga et al. | 438/421 |
| 8,883,610 B2 | 11/2014 | Seidel et al. | 438/411 |
| 2002/0158337 A1 | 10/2002 | Babich et al. | 257/758 |
| 2004/0213971 A1 | 10/2004 | Colburn et al. | 428/209 |
| 2004/0232552 A1 | 11/2004 | Wang et al. | 257/758 |
| 2005/0158337 A1 | 7/2005 | Fleming | 438/619 |
| 2006/0073695 A1 | 4/2006 | Filippi et al. | 438/619 |
| 2006/0088975 A1 | 4/2006 | Ueda | 438/421 |
| 2007/0096319 A1 | 5/2007 | Hsu et al. | 257/750 |
| 2007/0099417 A1 | 5/2007 | Fang et al. | 438/656 |
| 2007/0178713 A1 | 8/2007 | Jeng | 438/787 |
| 2007/0218677 A1* | 9/2007 | Engelhardt | H01L 21/76849 438/618 |
| 2007/0259516 A1 | 11/2007 | Jahnes et al. | 438/618 |
| 2008/0073748 A1 | 3/2008 | Bielefeld et al. | 257/522 |
| 2008/0124917 A1 | 5/2008 | Oh et al. | 438/637 |
| 2008/0169542 A1 | 7/2008 | Suzuki et al. | 257/684 |
| 2008/0169565 A1 | 7/2008 | Bonilla et al. | 257/761 |
| 2008/0227287 A1* | 9/2008 | Chang | H01L 21/76808 438/622 |
| 2008/0299758 A1* | 12/2008 | Harada | H01L 21/7682 438/619 |
| 2008/0299763 A1* | 12/2008 | Ueki | H01L 21/7682 438/627 |
| 2009/0093112 A1* | 4/2009 | Al-Bayati | H01L 21/3105 438/618 |
| 2009/0093115 A1* | 4/2009 | Park | H01L 21/76834 438/653 |
| 2009/0246706 A1* | 10/2009 | Hendel | G03F 7/70408 430/314 |
| 2012/0300542 A1* | 11/2012 | Uchida | G11C 11/161 365/171 |
| 2012/0319279 A1* | 12/2012 | Isobayashi | H01L 23/4821 257/751 |
| 2013/0230987 A1* | 9/2013 | Draeger | H01L 21/02126 438/694 |
| 2014/0061926 A1* | 3/2014 | Han | H01L 21/76835 257/760 |

OTHER PUBLICATIONS

Translation of Official Communication from German Patent Office for German Patent Application No. 10 2008 059 650.7 dated Sep. 25, 2009.

Translation of Official Communication from German Patent Office for German Patent Application No. 10 2008 059 650.7 dated Nov. 11, 2010.

Translation of Official Communication from German Patent Office for German Patent Application No. 10 2010 030 757.2 dated Feb. 18, 2011.

Lee and Graves, "The effect of VUV radiation from Ar/O2 plasmas on low-k SiOCH films," J. Phys. D: Appl. Phys., 44:325203, 2011.

* cited by examiner

ANISOTROPIC MATERIAL DAMAGE PROCESS FOR ETCHING LOW-K DIELECTRIC MATERIALS

BACKGROUND OF THE INVENTION

1. Field of the Invention

The disclosed subject matter relates generally to the fabrication of semiconductor devices, and, more particularly, to an anisotropic material damage process for etching low-k dielectric materials.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

In such modern integrated circuits, a limiting factor of device performance is the signal propagation delay caused by the switching speed of the transistor elements. As the channel length of these transistor elements has now reached 50 nm and less, the signal propagation delay is no longer limited by the field effect transistors. Rather, the signal propagation delay is limited, owing to the increased circuit density, by the interconnect lines, since the line-to-line capacitance (C) is increased and also the resistance (R) of the lines is increased due to their reduced cross-sectional area. The parasitic RC time constants and the capacitive coupling between neighboring metal lines, therefore, require the introduction of a new type of material for forming the metallization layer.

Traditionally, metallization layers, i.e., the wiring layers including metal lines and vias for providing the electrical connection of the circuit elements according to a specified circuit layout, are formed by a dielectric layer stack including, for example, silicon dioxide and/or silicon nitride, with aluminum as the typical metal. Since aluminum suffers from significant electromigration at higher current densities that may be necessary in integrated circuits having extremely scaled feature sizes, aluminum is being replaced by, for instance, copper, which has a significantly lower electrical resistance and a higher resistivity against electromigration. For highly sophisticated applications, in addition to using copper and/or copper alloys, the well-established and well-known dielectric materials silicon dioxide ($k\approx 4.2$) and silicon nitride ($k>7$) may increasingly be replaced by so-called low-k dielectric materials having a relative permittivity of approximately 3.0 and less. However, the transition from the well-known and well-established aluminum/silicon dioxide metallization layer to a copper-based metallization layer possibly in combination with a low-k dielectric material is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper lines and vias. Typically, in the damascene technique, the dielectric layer is deposited and then patterned for receiving trenches and via openings that are subsequently filled with copper or alloys thereof by plating methods, such as electroplating or electroless plating. Moreover, since copper readily diffuses in a plurality of dielectrics, such as silicon dioxide and in many low-k dielectrics, the formation of a diffusion barrier layer at interfaces with the neighboring dielectric material may be required. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration.

During the filling in of a conductive material, such as copper, into the trenches and via openings, a significant degree of overfill has to be provided in order to reliably fill the corresponding openings from bottom to top without voids and other deposition-related irregularities. Consequently, after the metal deposition process, excess material may have to be removed and the resulting surface topography is to be planarized, for instance, by using electrochemical etch techniques, chemical mechanical polishing (CMP) and the like. For example, during CMP processes, a significant degree of mechanical stress may be applied to the metallization levels formed so far, which may cause structural damage to a certain degree, in particular when sophisticated dielectric materials of reduced permittivity are used. As previously explained, the capacitive coupling between neighboring metal lines may have a significant influence on the overall performance of the semiconductor device, in particular in metallization levels, which are substantially "capacitance driven," i.e., in which a plurality of closely spaced metal lines have to be provided in accordance with device requirements, thereby possibly causing signal propagation delay and signal interference between neighboring metal lines. For this reason, so-called low-k dielectric materials or ultra-low-k (ULK) materials may be used, which may provide a dielectric constant of 3.0 and significantly less in order to enhance the overall electrical performance of the metallization levels. On the other hand, typically, a reduced permittivity of the dielectric material is associated with a reduced mechanical stability, which may require sophisticated patterning regimes so as to not unduly deteriorate reliability of the metallization system.

The continuous reduction of the feature sizes, however, with gate lengths of approximately 40 nm and less, may demand for even more reduced dielectric constants of the corresponding dielectric materials. For this reason, it has been proposed to introduce "air gaps," at least at critical device areas, since air or similar gases may have a dielectric constant of approximately 1.0.

Air gaps may be formed by etching the dielectric material of the metallization layer under consideration selectively with respect to the metal lines down to a specified depth. Consequently, a self-aligned technique may be accomplished by using the etch selectivity between the metal lines and the low-k or ULK dielectric material. However, etching processes for low-k and ULK materials are complex. A conventional etch process employs a reactive ion plasma etch process (e.g., using $NH_3$). Although the reactive ion etch is somewhat self-aligned, there is an anisotropic component that has a propensity to result in undercutting of the metal lines when the etch is performed. In addition, the reactive ion plasma etch process can damage a cap layer formed above the metal lines to prevent electromigration of the metal into the dielectric material, thereby causing reliability issues at the interface between the metal line and the cap layer. In the corner regions of the metal lines, the cap layer covers edges of a liner layer surrounding the metal line. Damage to the cap layer can result in corner rounding and additional reliability issues arising from defects introduced into the liner.

The present application is directed to various methods for forming air gaps in metal line structures so as to eliminate or reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive line air gaps. One illustrative method includes forming a mask layer above or in a dielectric material. The dielectric material is exposed to photon radiation in an ambient atmosphere comprising a carbon gettering agent to generate damaged portions of the dielectric material. The mask layer blocks the photon radiation. The damaged portions of the dielectric material are removed.

Another illustrative method includes forming a plurality of conductive lines disposed in a first dielectric material. The first dielectric material is exposed to photon radiation in an ambient atmosphere comprising a carbon gettering agent to generate damaged portions of the first dielectric material. The conductive lines block the photon radiation. The damaged portions of the first dielectric material are removed to define recesses between the conductive lines. A cap layer is formed above the conductive lines without filling the recesses to define an air gap between the conductive lines. A second dielectric material is formed above the cap layer.

Yet another illustrative method includes forming a patterned mask layer above a dielectric material. The dielectric material is exposed to photon radiation in an ambient atmosphere comprising a carbon gettering agent to generate damaged portions of the dielectric material. The mask layer blocks the photon radiation. The damaged portions of the dielectric material are removed to define recesses in the dielectric material. The recesses are filled with a conductive material.

BRIEF DESCRIPTION OF THE DRAWINGS

The disclosure may be understood by reference to the following description taken in conjunction with the accompanying drawings, in which like reference numerals identify like elements, and in which.

Figure 1A:
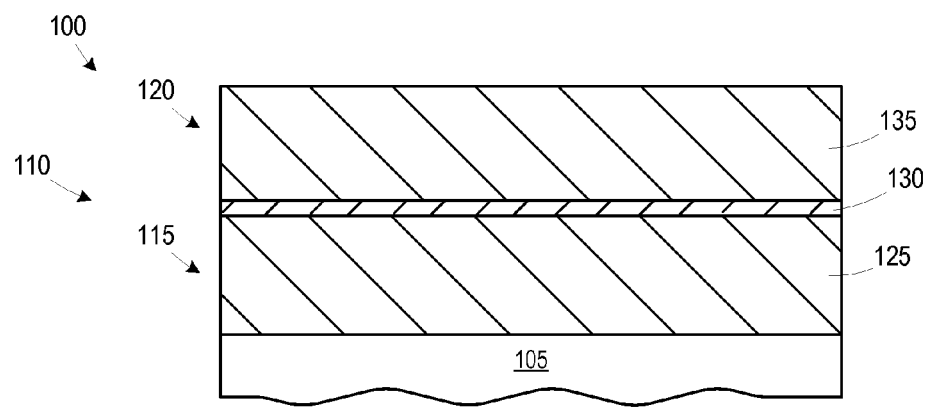
FIGS. 1A-1K are cross-sectional diagrams depicting illustrative techniques for forming an air gap structure using a reactant photon exposure and etch process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of forming an air gap structure. With reference to the attached drawings various illustrative embodiments of the methods and devices disclosed herein will now be described in more detail.

FIGS. 1A-1K are cross-sectional diagrams illustrating a method for forming an air gap structure in a semiconductor device 100, which, in the present embodiment, may be represented by an integrated circuit including circuit elements, such as transistors, capacitors, resistors and the like. FIG. 1A illustrates the device 100 including a device level (not shown) formed in and above a substrate 105 in which semiconductor-based circuit elements may be provided. For convenience, any such circuit elements are not shown in FIG. 1A. The substrate 105 may also include any appropriate microstructure features, such as micromechanical components, optoelectronic components and the like, wherein at least some of these components may require an interconnect structure formed in a metallization system 110. In highly complex integrated circuits, a very large number of electrical connections may be required and, thus, a plurality of metallization layers 115, 120 may typically be formed in the metallization system 110. For example, the metallization layers 115, 120 may represent two of a plurality of metallization layers of the system 110, each of which may connect to a lower-lying metallization layer in accordance with the required overall circuit layout. In other cases, the layer 115 of the metallization system 110 may represent a contact structure which may include appropriate contact elements, for instance partially formed on the basis of a metal-containing material, in order to connect to semiconductor devices in the device layer. In this case, the metallization layer 115 may be considered as the very first metallization layer, while the layer 120 may be considered as an interface connecting the metallization system 110 with the actual circuit elements formed in and above the substrate 105.

The metallization layer 115 may comprise a dielectric material 125, which may be provided in the form of any appropriate material, such as a low-k dielectric material, a dielectric material having a dielectric constant of approximately 2.7 or higher or an ultra-low-k (ULK) material, a dielectric material having a dielectric constant of approximately 2.5 or lower. The metallization layer 120 includes a layer 130 (e.g., SiCN or SiN) and a dielectric material 135, which may be similar to the dielectric material 125 in the metallization layer 115.

Figure 1B:
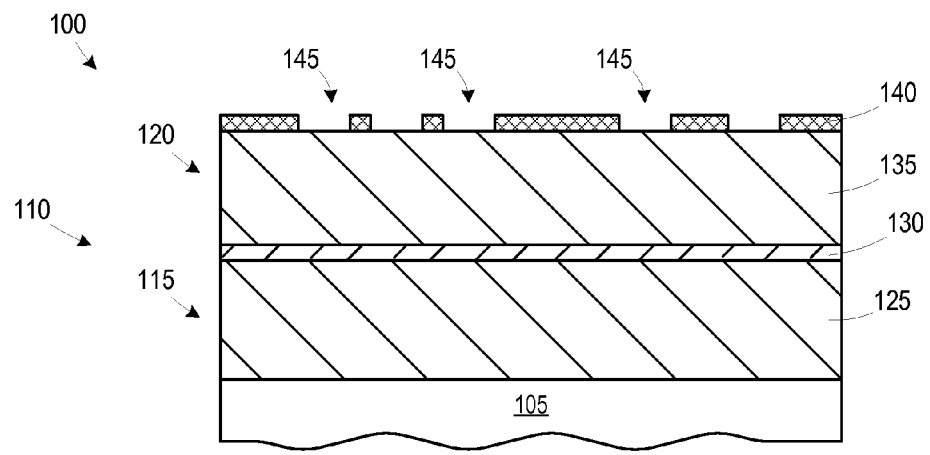

FIG. 1B illustrates the device 100 after a patterned hard mask layer 140 (e.g., (TiN, TEOS, SiN, etc.) is formed above the dielectric material 135. The hard mask layer 140 may be formed by depositing a hard mask material, forming a photoresist layer above the hard mask material, patterning the photoresist layer using a photolithography process, and etching the hard mask material exposed by the patterned photoresist layer to define openings 145.

Figure 1C:
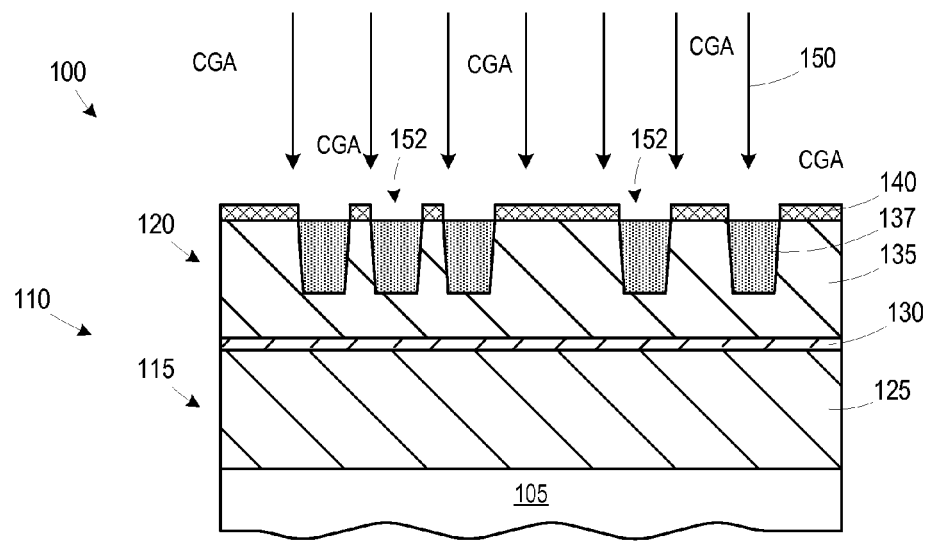

FIG. 1C illustrates the device after a reactant photon exposure process 150 is performed to generate damaged regions 137 in the dielectric material 135. The reactant photon exposure process 150 includes providing an ambient including a carbon gettering agent (CGA) and concurrently illuminating the device 100 with a radiation source, such as a UV or VUV radiation source. In general, the photons from the radiation source disrupt bonds in the dielectric material 135, thereby providing unattached carbon groups (e.g., methyl groups). The CGA molecules react with the carbon groups and prevent the bonds from reforming and allow the gettered carbon to exit the film, resulting in carbon depletion in the exposed portions of the dielectric material 135. As a result of this carbon gettering, the damaged (carbon-depleted) portions 137 of the dielectric material 135 become soluble in a wet etch solution. In the illustrated embodiment, the CGA may be oxygen gas ($O_2$), ammonia gas ($NH_3$), or some other gas that may react with the carbon groups liberated by the radiation and preventing the bonds with the carbon groups from reforming. The photons may be collimated so as to reduce the likelihood of scattering. Because, the carbon gettering process only occurs in regions exposed to the collimated radiation, the reactant photon exposure process 150 is highly anisotropic, as compared to a reactant ion plasma etch process that has a higher relative degree of scattering of damaging species (ions, radicals). The depth of the recesses 152 may be controlled based on the photon dose (exposure intensity and time), and resulting penetration depth, of the radiation.

Figure 1D:
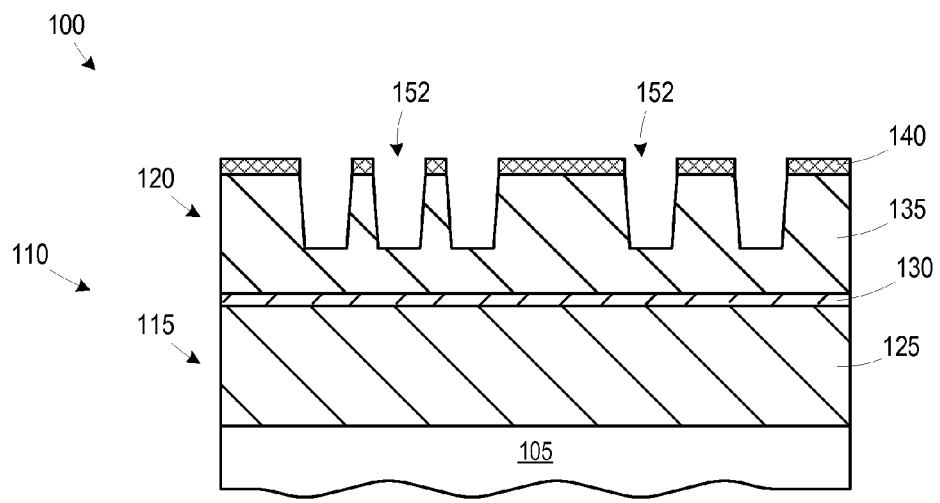

FIG. 1D illustrates the device 100 after performing a wet etch process (e.g., HF) to remove the damaged portions 137 of the dielectric material 135 to form recesses 152.

Figure 1E:
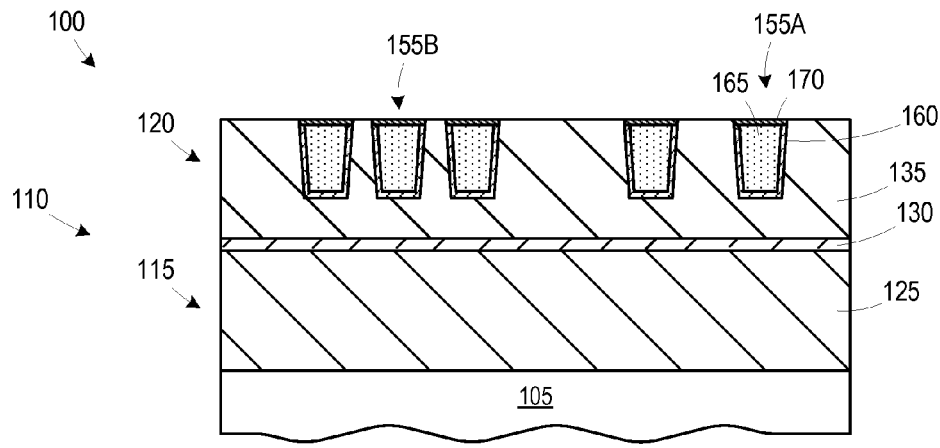

FIG. 1E illustrates the device 100 after several processes are performed to form conductive lines 155A, 155B in the recesses 152. A multiple stage fill process forms a liner layer 160 (e.g., TaN, TiN, Ta, etc.) in the recesses 152, followed by a metal fill material 165 (e.g., copper) to overfill the recesses 152. A planarization process removes the overfill, and the hard mask layer 140. A cap layer 170 (e.g., AlN or Co) is formed above the metal fill material 165 and the edges of the liner layer 160. The liner layer 160 and the cap layer 170 prevent diffusion of the metal fill material 165 into the dielectric material 135. The cap layer 170 also serves to protect the metal fill material 165 during subsequent processing steps.

Figure 1F:
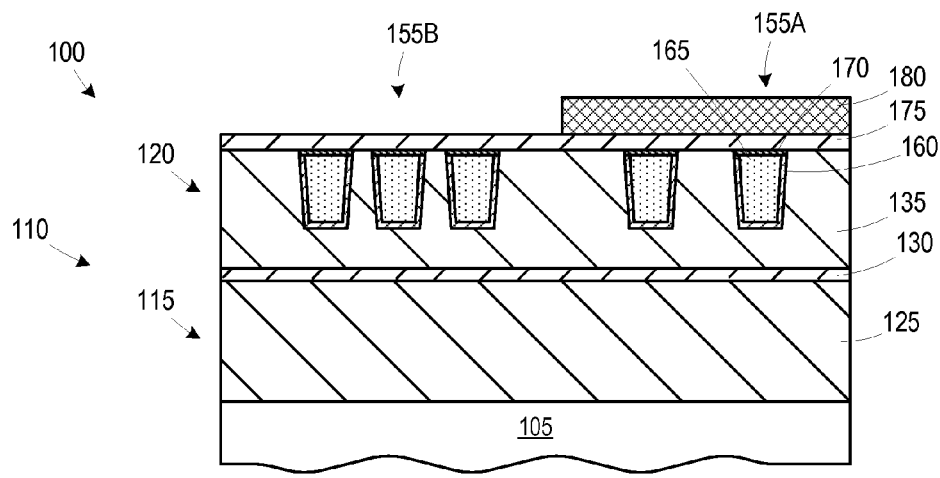
Figure 1G:
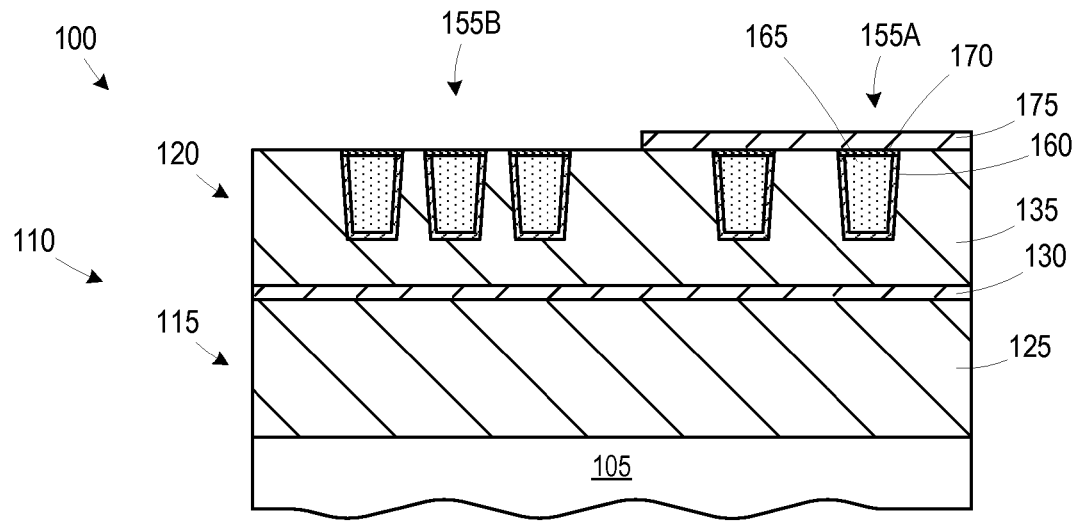

FIG. 1F illustrates the device 100 after a cap layer 175 (e.g., SiCN) is formed above the dielectric material 135 and a patterned hard mask layer 180 is formed above selected metal lines 155A. The hard mask layer 180 may include a stack of layers, such as a stack including an organic polymer, SiNCH, TEOS and SiON. The hard mask layer 180 may be patterned using a photoresist layer and one or more etch processes to remove the various layers in the stack, whereby the etch processes are terminated upon exposing the cap layer 175. FIG. 1G illustrates the device 100 after an etch process is performed to remove the cap layer 175 not covered by the hard mask layer 180 (i.e., above the lines 155B) and another etch process is performed to remove the hard mask layer 180.

Figure 1H:
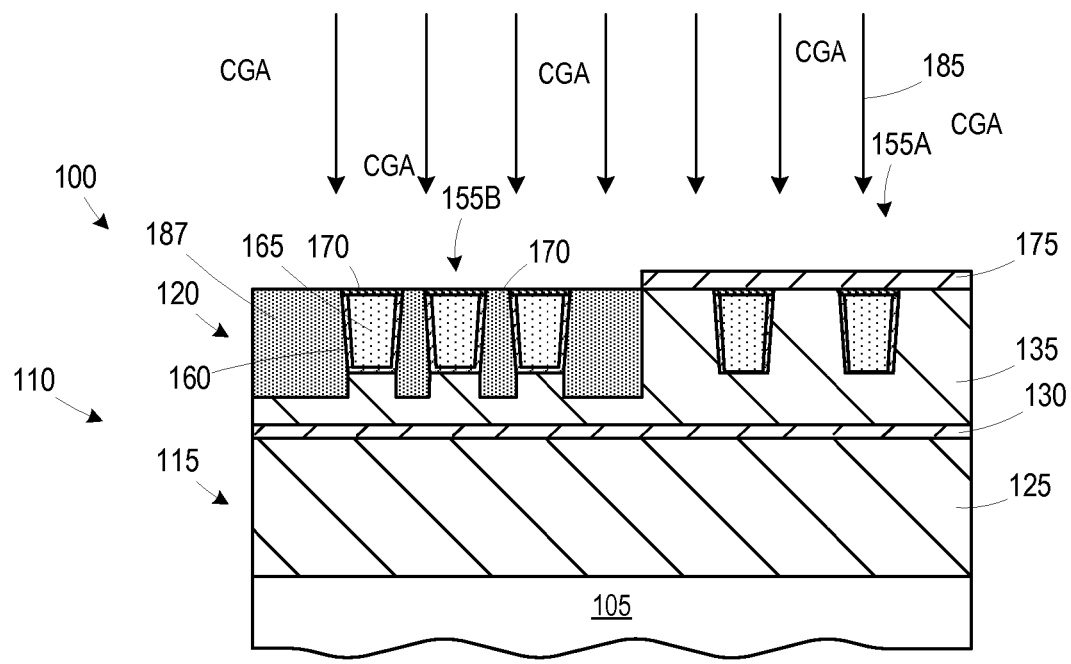

FIG. 1H illustrates the device 100 after a second reactant photon exposure process 185 is performed to generate damaged portions 187 in the dielectric material 135. Again, the reactant photon exposure process 185 includes providing an ambient including a carbon gettering agent (CGA) and illuminating the device 100 with a radiation source, such as a UV or VUV radiation source. The use of AlN prevents damage to the Cu when $O_2$ is used as the CGA, and the use of $NH_3$ as the CGA prevents damage to the Cu if it is uncapped or to Co if it is used as a cap layer.

Figure 1I:
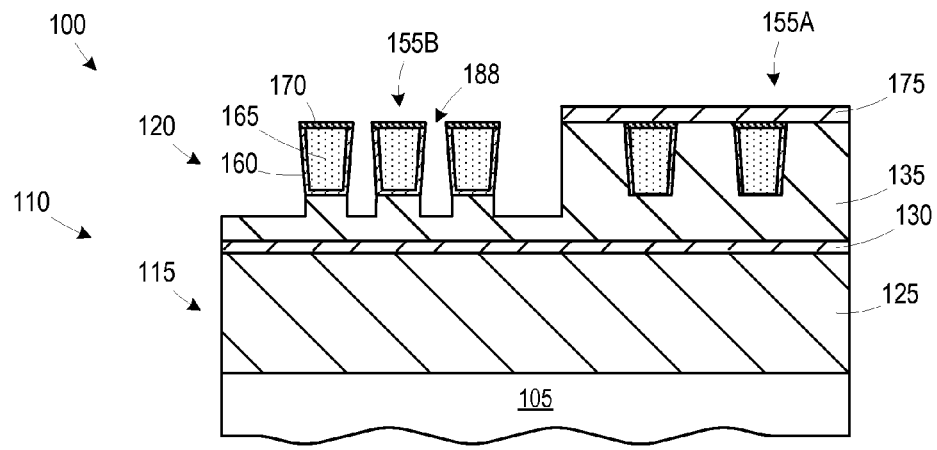

FIG. 1I illustrates the device 100 after performing a wet etch process (e.g., HF) to remove the damaged portions 187 of the dielectric material 135 to form recesses 188 between the metal lines 155B.

During the second reactant photon exposure process 185, the metal lines 155B embedded in the dielectric material 135 act as a mask layer to the process 185, thus allowing the recesses 188 to be substantially self-aligned between the metal lines 155B. Furthermore, due to the enhanced anisotropy of the reactant photon exposure process 185, the depth of the recesses 188 may be greater than the depth of the metal lines 155B without substantially undercutting the metal lines 155B. Moreover, because there is no particle bombardment in the reactant photon exposure process 185, surface damage to the cap layer 170 on the metal lines 155B is also reduced as compared to a reactive ion plasma etch process.

Figure 1J:
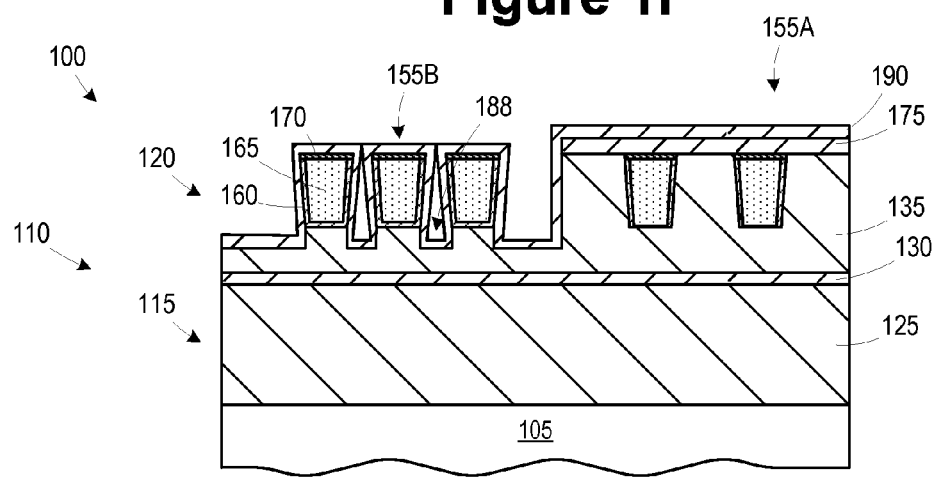

FIG. 1J illustrates the device 100 after a conformal deposition process is performed to form a cap layer 190 (e.g., SiCN) above the metal lines 155B. The cap layer 190 does not completely fill the recesses 188, thereby creating an air gap between the metal lines 155B.

Figure 1K:
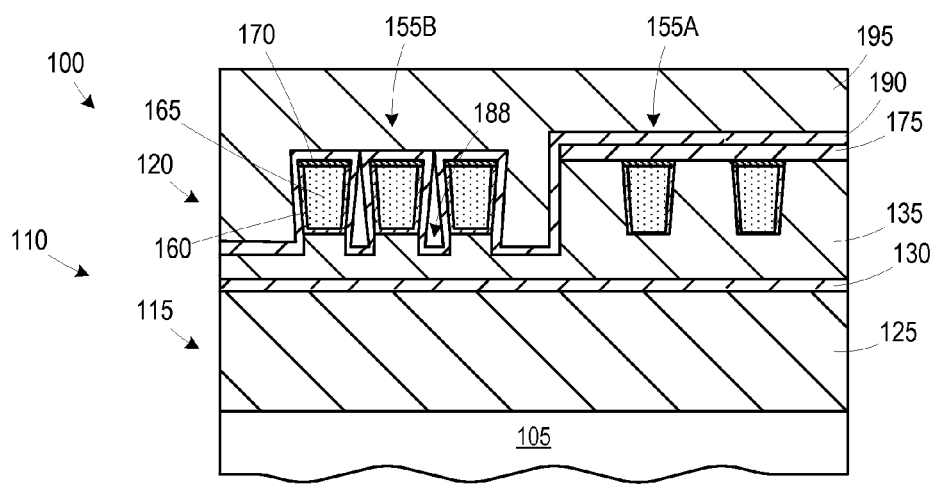

FIG. 1K illustrates the device 100 after additional dielectric material 195 is formed above the metal lines 155A, 155B. The dielectric material 195 may be similar to the dielectric material 135.

The techniques for forming an air gap structure described herein have numerous advantages. Because the etch processes for patterning the dielectric material 135 do not include a reactive ion bombardment component, the damage to surrounding structures or layers is minimized. Also, the depth of the air gap can be increased to improve the operating characteristics of the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a plurality of conductive lines disposed in a first dielectric material, wherein said conductive lines comprise a conductive fill material and a liner layer disposed between at least a bottom surface of said conductive fill material and said first dielectric material;
exposing said first dielectric material to photon radiation in an ambient atmosphere comprising a carbon gettering agent to generate damaged portions of said first dielectric material, wherein said conductive lines block said photon radiation, and said damaged portions have a depth greater than a depth of a bottom surface of said liner layer of said conductive lines;
removing said damaged portions of said first dielectric material to define recesses between said conductive lines, said recesses having a depth greater than said depth of said bottom surface of said liner layer of said conductive lines;
forming a cap layer above said conductive lines without filling said recesses to define an air gap between said conductive lines; and
forming a second dielectric material above said cap layer.

2. The method of claim 1, wherein said carbon gettering agent comprises at least one of oxygen or ammonia.

3. The method of claim 1, wherein said conductive lines comprise a second cap layer disposed above conductive fill material.

4. The method of claim 3, wherein said second cap layer comprises aluminum nitride and said carbon gettering agent comprises oxygen or ammonia.

5. The method of claim 3, wherein said second cap layer comprises cobalt and said carbon gettering agent comprises ammonia.

6. The method of claim 3, wherein said second cap layer covers edges of said liner layer.

7. The method of claim 1, wherein said conductive lines comprise copper.

8. The method of claim 1, wherein removing said damaged portions comprises performing a wet etch process.

9. The method of claim 1, wherein forming said plurality of conductive lines comprises:
forming a patterned mask layer above said first dielectric material;
exposing said first dielectric material to photon radiation in an ambient atmosphere comprising a carbon gettering agent to generate first damaged portions of said first dielectric material, wherein said mask layer blocks said photon radiation;
removing said first damaged portions of said dielectric material to define line recesses in said dielectric material; and
filling said line recesses with a conductive line material.

10. The method of claim 9, wherein said conductive line material comprises copper.

11. The method of claim 9, wherein said carbon gettering agent comprises at least one of oxygen or ammonia.

12. The method of claim 9, wherein removing said first damaged portions comprises performing a wet etch process.

13. A method, comprising:
forming a plurality of conductive lines disposed in a first dielectric material, wherein said conductive lines comprise a liner layer disposed between at least a bottom surface of a conductive fill material and said first dielectric material;
forming a first cap layer above said plurality of conductive lines, wherein said first cap layer covers top surfaces of said conductive fill material and edges of said liner layer;
exposing said first dielectric material to photon radiation in an ambient atmosphere comprising a carbon gettering agent to generate damaged portions of said first dielectric material, wherein said conductive lines block said photon radiation and said first cap layer covers said top surfaces of said conductive fill material during said exposing;
removing said damaged portions of said first dielectric material to define recesses between said conductive lines, wherein said damaged portions and said recesses have a depth greater than a depth of a bottom surface of said liner layer of said conductive lines;
forming a second cap layer above said conductive lines without filling said recesses to define an air gap between said conductive lines; and
forming a second dielectric material above said second cap layer.

14. The method of claim 13, wherein said carbon gettering agent comprises at least one of oxygen or ammonia.

15. The method of claim 13, wherein said first cap layer comprises aluminum nitride and said carbon gettering agent comprises oxygen or ammonia.

16. The method of claim 13, wherein said second cap layer comprises cobalt and said carbon gettering agent comprises ammonia.

17. The method of claim 13, wherein removing said damaged portions comprises performing a wet etch process.

18. The method of claim 13, wherein forming said plurality of conductive lines comprises:
forming a patterned mask layer above said first dielectric material;
exposing said first dielectric material to photon radiation in an ambient atmosphere comprising a carbon gettering agent to generate first damaged portions of said first dielectric material, wherein said mask layer blocks said photon radiation;
removing said first damaged portions of said dielectric material to define line recesses in said dielectric material;
forming said liner layer in said line recesses; and
filling said line recesses with said conductive fill material.

* * * * *

UNITED STATES PATENT AND TRADEMARK OFFICE
CERTIFICATE OF CORRECTION

| | | |
|---|---|---|
| PATENT NO. | : 9,583,380 B2 | Page 1 of 1 |
| APPLICATION NO. | : 14/334385 | |
| DATED | : February 28, 2017 | |
| INVENTOR(S) | : Errol Todd Ryan | |

It is certified that error appears in the above-identified patent and that said Letters Patent is hereby corrected as shown below:

In the Claims

Column 7, Line 35 (Claim 3, Line 2), after "above" insert -- said --.

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*